United States Patent
Boguszewicz

(10) Patent No.: US 9,641,169 B2
(45) Date of Patent: May 2, 2017

(54) CONVEYING INFORMATION BETWEEN HIGH SIDE AND LOW SIDE DRIVER

(71) Applicant: Infineon Technologies Austria AG, Villach (AT)

(72) Inventor: Remigiusz Viktor Boguszewicz, Essen (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/815,816

(22) Filed: Jul. 31, 2015

(65) Prior Publication Data
US 2017/0033789 A1 Feb. 2, 2017

(51) Int. Cl.
*H03K 17/567* (2006.01)
(52) U.S. Cl.
CPC .................................. *H03K 17/567* (2013.01)
(58) Field of Classification Search
CPC ...... H03K 17/10; H03K 17/102; H03K 17/12; H03K 17/16; H03K 17/567; H03K 17/601; H03K 17/64; H03K 17/691
USPC .................. 327/108, 109, 110, 111, 112
See application file for complete search history.

(56) References Cited

U.S. PATENT DOCUMENTS

| | | | |
|---|---|---|---|
| 5,543,740 A * | 8/1996 | Wong | H03K 17/063 327/108 |
| 5,767,562 A | 6/1998 | Yamashita | |
| 6,404,659 B1 | 6/2002 | Oyabe | |
| 8,004,339 B2 | 8/2011 | Barrow | |
| 8,351,235 B2 | 1/2013 | Akahane | |
| 2014/0002140 A1 | 1/2014 | Wang | |

FOREIGN PATENT DOCUMENTS

EP 2660979 A1 11/2013

* cited by examiner

*Primary Examiner* — John Poos
(74) *Attorney, Agent, or Firm* — Slater Matsil, LLP

(57) ABSTRACT

A circuit for conveying information from a sender component to a receiver component is provided. The sender component is a high side component and the receiver component is a low side component or the sender component is a low side component and the receiver component is a high side component. The low side component is arranged to drive a first electronic switch of a half bridge and the high side component is arranged to drive a second electronic switch of the half bridge. The circuit includes a first voltage-decoupling device and a second voltage-decoupling device that are arranged such that a voltage conveyed from the sender component to the receiver component is modulated by the sender component and conveyed across the first voltage-decoupling device and the second voltage-decoupling device depending on the information.

17 Claims, 2 Drawing Sheets

CONVEYING INFORMATION BETWEEN HIGH SIDE AND LOW SIDE DRIVER

TECHNICAL FIELD

Embodiments of the present invention relate to a circuit for conveying information between a high side driver and low side driver and a method for operating such circuit.

SUMMARY

A first embodiment relates to a circuit for conveying information from a sender component to a receiver component. The sender component is a high side component and the receiver component is a low side component or the sender component is a low side component and the receiver component is a high side component. The low side component is arranged to drive a first electronic switch of a half bridge and the high side component is arranged to drive a second electronic switch of the half bridge. The circuit comprises a first voltage-decoupling device and a second voltage-decoupling device that are arranged such that a voltage conveyed from the sender component to the receiver component is modulated by the sender component and conveyed across the first voltage-decoupling device and the second voltage-decoupling device depending on the information.

A second embodiment relates to a method for conveying information from a sender component to a receiver component. The sender component is a high side component and the receiver component is a low side component or the sender component is a low side component and the receiver component is a high side component. The low side component is arranged to drive a first electronic switch of a half bridge and the high side component is arranged to drive a second electronic switch of the half bridge. The method includes modulating a voltage and conveying the modulated voltage from the sender component across a first voltage-decoupling device and a second voltage-decoupling device depending on the information.

BRIEF DESCRIPTION OF THE DRAWINGS

Embodiments are shown and illustrated with reference to the drawings. The drawings serve to illustrate the basic principle, so that only aspects necessary for understanding the basic principle are illustrated. The drawings are not to scale. In the drawings the same reference characters denote like features.

DETAILED DESCRIPTION OF ILLUSTRATIVE EMBODIMENTS

Figure 1:
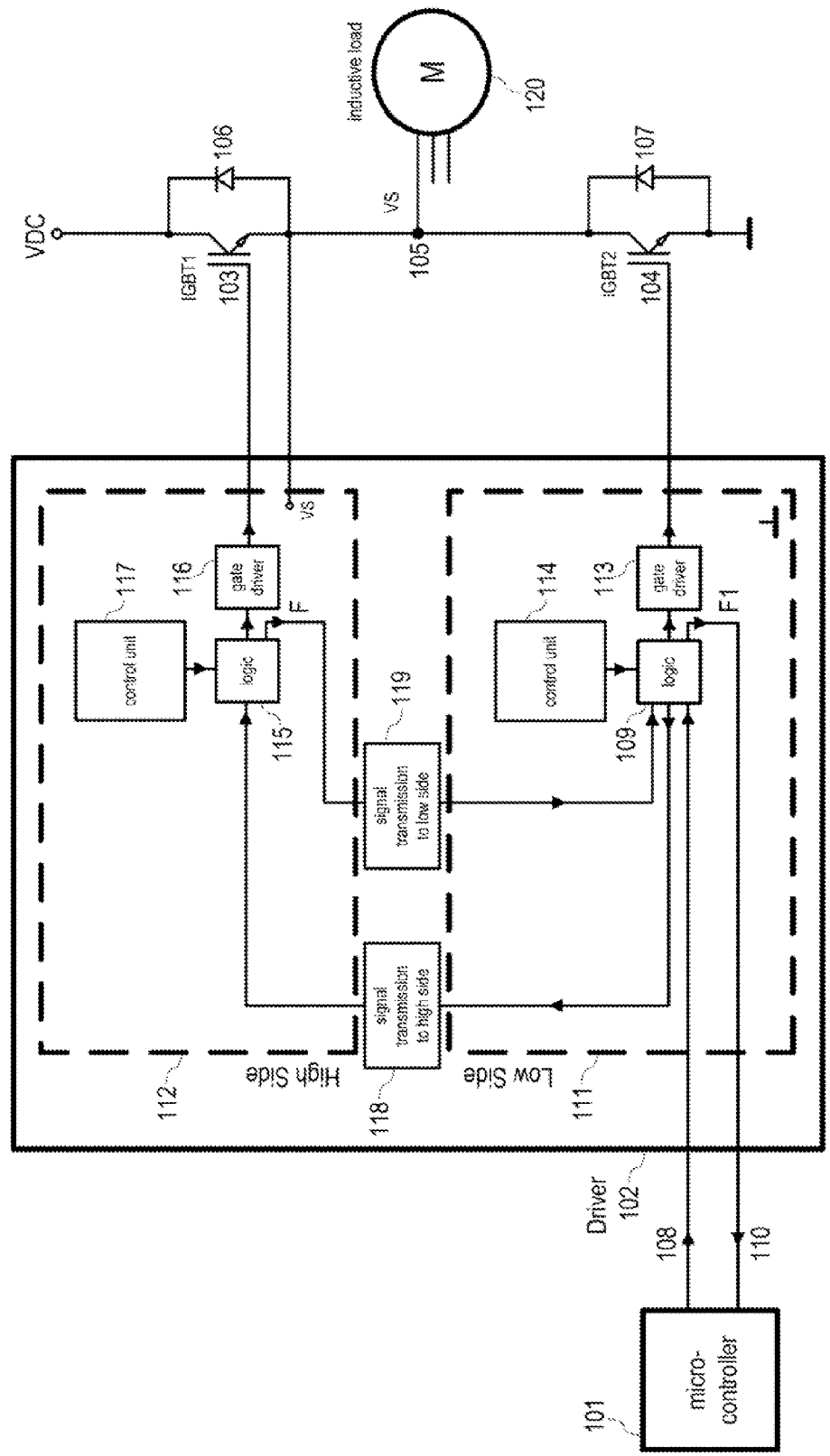
FIG. 1 shows a schematic block circuitry comprising a microcontroller, a driver and two electronic switches of a half-bridge circuitry.

FIG. 1 shows a schematic block circuitry comprising a microcontroller 101, a driver 102 and two electronic switches 103 and 104 of a half-bridge circuitry. The switches 103 and 104 are exemplarily realized as IGBTs (insulated-gate bipolar transistors).

The collector of the switch 103 is connected to a supply voltage VDC, wherein the emitter of the switch 104 is connected to ground. The emitter of the switch 103 is connected to the collector of the switch 104 and to a node 105. This node 105 is connected to an inductive load, e.g., a motor 120. The node 105 also supplies a voltage VS.

A body diode 106 is arranged antiparallel across the collector and emitter of the switch 103 and a body diode 107 is arranged antiparallel across the collector and emitter of the switch 104.

The driver 102 comprises a low side driver 111 and a high side driver 112. The low side driver 111 comprises logic circuitry 109, a gate driver 113 and a control unit 114. The high side driver 112 comprises logic circuitry 115, a gate driver 116 and a control unit 117.

The microcontroller 101 supplies a control signal 108 to the logic circuitry 109. The logic circuitry 109 may be arranged to supply a feedback signal 110 back to the microcontroller 101. The logic circuitry 109 controls the gate driver 113, which drives the base of the switch 104. The logic circuitry 109 is also supplied information from the control unit 114. The control unit 114 may control one or more of power supply information, current information and temperature information.

For such purpose, the control unit 114 may comprise a sensor that determines at least one of power, current and temperature.

The logic circuitry 115 is supplied with information from the control unit 117, which may one or more of power supply information, current information and temperature information. The logic circuitry 115 controls the gate driver 116, which drives the base of the switch 103.

Also, the driver 102 comprises a conversion component 118 that is arranged to transmit a signal from (the logic circuitry 109 of) the low side driver 111 to the (logic circuitry 115 of the) high side driver 112 and a conversion component 119 that is arranged to transmit a signal in opposite direction, i.e., from (the logic circuitry 115 of) the high side driver 112 to the (logic circuitry 109 of the) low side driver 111.

Hence the switches 103 and 104 may be power switches (e.g., transistors) with separate control and monitoring circuits, e.g., the high side driver 112 and low side driver 111. The high side driver 112 and the low side driver 111 are separated via the conversion components 118 and 119. Each of the high side driver 112 or the low side driver 111 may experience conditions that are determined by the respective control units 117 and 114, e.g., short-circuit, low power, high or low temperature, etc. Information provided by the control units 117, 114 are conveyed towards the microcontroller 101, e.g., for diagnostic, safety and/or monitoring purposes.

The logic circuitry 109 of the low side driver 111 can directly feed such information towards the microcontroller 101 as the ground potential is (substantially) the same for the microcontroller and the low side driver 111. However, information from the control unit 117 towards the microcontroller 101 is more difficult, because the high side driver 112 and the microcontroller 101 do not share the same potential; in fact there is a voltage gap amounting to VS between these components. Hence, the information exchange between the microcontroller 101 and the high side driver 112 needs to be transferred via the conversion components 118 and 119.

Figure 2:
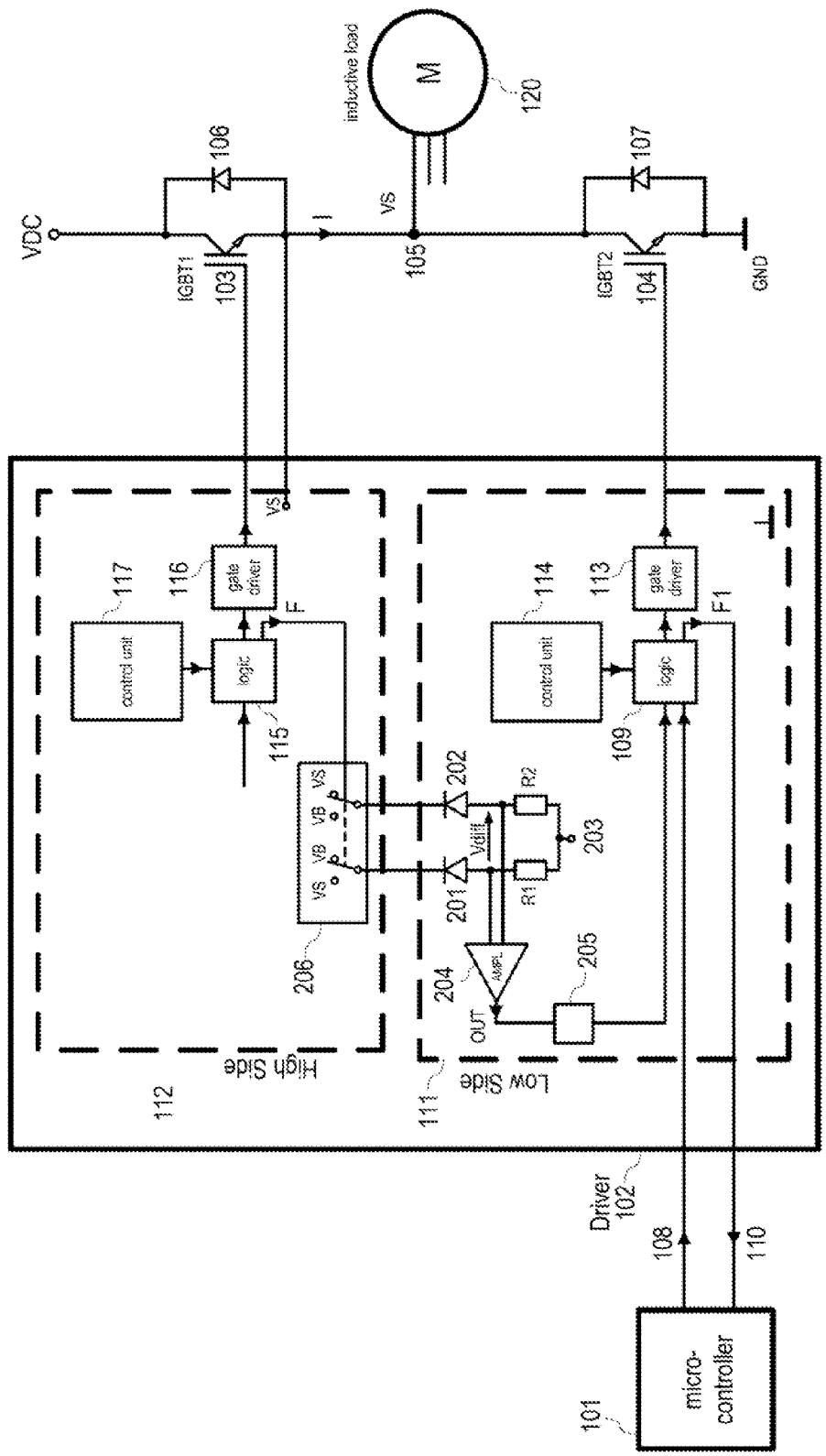
FIG. 2 shows an exemplary circuitry based on FIG. 1, which allows signal transmission from the high side driver to the low side driver.

FIG. 2 shows an exemplary circuit based on FIG. 1, which allows signal transmission from the high side driver 112 to the low side driver 111 (and thus to the microcontroller 101). This embodiment utilizes two high-voltage diodes 201 and 202.

The cathodes of the diodes 201 and 202 are switched complementary to each other, wherein a voltage VS indicates the negative supply voltage of the high side driver 112 and a voltage VB indicates the positive supply voltage of the high side driver 112. For example, the cathode of the diode 201 is switched to the voltage VS and the cathode of the diode 202 is switched to the voltage VB, or the cathode of the diode 201 is switched to the voltage VB and the cathode of the diode 202 is switched to the voltage VS.

Such complementary switching can be realized by a selector switch 206 that is driven by a signal F provided by the logic circuitry 115.

The anode of the diode 201 is connected to a node 203 via a resistor R1 and the anode of the diode 202 is connected to the node 203 via a resistor R2. The node 203 is connected to the positive supply voltage VDD of the low side driver 111.

A voltage across the anodes of the diodes 201 and 202 is determined via an operational amplifier 204 comprising two inputs and one output. The first input of the operational amplifier 204 is connected to the anode of the diode 201 and the second input of the operational amplifier 204 is connected to the anode of the diode 202. Hence, a voltage difference amounting to Vdiff is determined between the inputs of the operational amplifier 204. A signal OUT is provided at the output of the operational amplifier 204, which is conveyed to the logic circuitry 109 via a low-pass filter 205.

It is an option that the operational amplifier 204 is biased towards the signal OUT (which may be a voltage signal) in case the voltage difference Vdiff at its inputs is 0V; such bias leads to a defined logic level in case the voltage difference Vdiff is (substantially) 0V.

Any signal transfer from the high side driver 112 to the low side driver 111 may occur in case the voltage VS is substantially equal to ground GND level, i.e., VS≈GND. In this case, the diodes 201 and 202 are able to conduct electrical current; the logic state of the signal F at the output of the logic circuitry 115 determines the amount of electrical current flowing through the diodes 201 and 202 and thus the sign of the voltage difference Vdiff at the inputs of the operational amplifier 204.

Transferring information regarding a short circuit that occurs at the high side driver 112 may be achieved as follows.

After the switch 103 is switched on the current I at the node 105 may build up. The control unit 117 detects a short-circuit and indicates such short-circuit to the logic circuitry 115. The logic circuitry 115 disables (i.e., switches off) the switch 103 via the gate driver 116 and changes the logical value of the signal F at the output of the logic circuitry 115 that is connected towards the selector switch 206 thereby changing the connections of the diodes. Hence, the electrical potentials at the cathodes of the diodes 201 and 202 are changed as well.

Based on an inductive load connected to the node 105, e.g., the motor 120, the current I commutes via the body diode 107 of the switch 104, which results in the voltage VS (at the node 105) amounting (approximately) to GND potential, i.e., VS≈GND.

By the different currents crossing the diodes 201 and 202 the voltage difference at the inputs of the operational amplifier 204 obtains a defined sign (i.e., either plus or minus) and a defined value. At its output, the operational amplifier 204 supplies the voltage OUT according to such change at its inputs. The voltage OUT is fed to the logic circuitry 109 after being optionally filtered by the low-pass filter 205. Hence, such low-pass filtered voltage OUT that indicates the short circuit in the high side driver 112 can be forwarded to the microcontroller 101 via the logic circuitry 109 of the low side driver 111.

Hence, the following conditions can be separated in order to convey the information towards the low side. The switch 103 is switched off, but no fault condition is determined by the logic circuitry 115: The voltage VS at the node 105 reaches ground level, i.e., VS≈GND. If the cathode of the diode 201 is connected to VB and the cathode of the diode 202 is connected to VS (as exemplarily shown in FIG. 2), a current can flow via the resistor R2 and the diode 202, but no current or a reduced amount of current flows via the resistor R1 (the current flowing through the resistor R1 has a reduced amount compared to the current flowing through the resistor R2) and the diode 201, because the voltage at the node 203, e.g., the voltage VDD, is larger than VS, but below VB. Hence, at the anode of the diode 201 is a voltage amounting to VDD and at the anode of the diode 202 is a voltage amounting to VDD-Voff, wherein the voltage Voff results in the voltage drop across the resistor R2. This results in the voltage difference Vdiff at the inputs of the operational amplifier 204 amounting to:

$$Vdiff=VDD-(VDD-Voff)=+Voff.$$

The output OUT at the operational amplifier 204 amounts to low.

The switch 103 is switched on and no fault condition is determined by the logic circuitry 115. The voltage VS and the voltage VB are both higher than the voltage at the node 203. Both diodes 201 and 202 do not conduct any current, the voltage difference Vdiff amounts to approximately 0V. In this case, the output OUT at the operational amplifier 204 also amounts to low.

A fault condition is determined by the logic circuitry 115, the switch 103 is switched off and the logic circuitry 115 supplies a signal F to the selector switch 206 that changes the connections of the cathodes of the diodes 201 and 202, i.e., the cathode of the diode 201 is connected to VS and the cathode of the diode 202 is connected to VB. As indicated above, the voltage VS reaches ground level. Now, a current is conducted across the resistor R1 and the diode 201, but no current flows via the resistor R2 and the diode 202, because the voltage at the node 203 is higher than the voltage VS, but lower than the voltage VB. In this exemplary case, the voltage difference Vdiff at the inputs of the operational amplifier 204 amounts to:

$$Vdiff=(VDD-Voff)-VDD=-Voff.$$

In this case, the output OUT at the operational amplifier 204 amounts to high.

The operational amplifier 204 may be configured that it provides a first result, e.g., 0V at its output in case the voltage difference Vdiff at its inputs is either around 0V or amounts to +Voff. In addition, the operational amplifier 204 supplies a different result at its output, e.g. −5V, in case the voltage difference Vdiff amounts to −Voff. This can be realized by biasing the operational amplifier 204 such that it supplies the different result at its output in case the different voltage Vdiff drops below a certain threshold, e.g., −Voff/2.

It is noted that the operational amplifier 204 may be a comparator or it may be used as a comparator. The internal offset voltage of the operational amplifier 204 may for example amount to approximately 1V.

It is noted that the above also works if the selector switch 206 is used such that the fault condition F changes the connection of the cathode of the diode 201 from VS to VB and the cathode of the diode 202 from VB to VS. In such scenario, a voltage difference Vdiff amounting to +Voff indicates the fault condition to the low side driver 111 and needs to be separated from 0V and −Voff.

This approach is in particular beneficial, because a fault condition (e.g., short circuit or low-power supply) at the high side driver 112 results in switching off the switch 103, which then leads to the voltage VS at the node 105 reaching (substantially) ground level. This allows an efficient transmission of information from the high side driver 112 towards the low side driver 111 and further towards the microcontroller 101.

It is an advantage of this solution that information can be conveyed from the high side driver 112 towards the microcontroller 101 without using a high-voltage PMOS transistor. Instead, the diodes 201 and 202 can be used as voltage-decoupling devices, wherein the voltage at the cathodes of the diodes 201 and 202 may be modulated depending on the information to be conveyed from the high side driver 112 towards the low side driver 111. The low side driver 111 may comprise a decoding component for processing the modulated information and for conveying it towards the microcontroller 101. The diodes 201 and 202 may, in particular, be realized as high-voltage diodes.

The solution presented herein conveying information from the high side driver to the low side driver works in an analogous manner in the opposite direction, i.e., from the low side driver to the high side driver. In such case, a selector switch may be provided at the low side driver and the diodes and amplifier may be arranged at the high side driver.

The examples suggested herein may in particular be based on at least one of the following solutions. In particular combinations of the following features could be utilized in order to reach a desired result. The features of the method could be combined with any feature(s) of the device, apparatus or system or vice versa.

A circuit is provided for conveying an information from a sender component to a receiver component, wherein the sender component is a high side component and the receiver component is a low side component or wherein the sender component is a low side component and the receiver component is a high side component, wherein the low side component is arranged to drive a first electronic switch of a half bridge and the high side component is arranged to drive a second electronic switch of the half bridge, comprising a first voltage-decoupling device and a second voltage-decoupling device that are arranged such that a voltage conveyed from the sender component to the receiver component is modulated by the sender component and conveyed across the first voltage-decoupling device and the second voltage-decoupling device depending on the information.

The high side component may be a high side driver comprising a gate driver for driving the second electronic switch (high side switch) and the low side component may be a low side driver comprising a gate driver for driving the first electronic switch (low side switch).

The first electronic switch and the second electronic switch may each be a transistor, in particular an IGBT. The first electronic switch and the second electronic switch may each have a body diode that is arranged anti-parallel to the collector emitter path.

The half bridge may also be referred to as "H bridge". The half bridge enables a voltage to be applied to a load in either direction. A node between the switches of the half bridge may be connected to the load, e.g., an inductive load, a motor, etc.

The high side switch is directly or indirectly connected between a supply voltage and a load and the low side switch is directly or indirectly connected between a load and ground.

In an embodiment, the receiver component comprises a demodulator to process the modulated voltage supplied by the sender component.

In an embodiment, the first voltage-decoupling device comprises a first diode and the second voltage-decoupling device comprises a second diode, wherein the information corresponds to a voltage difference modulated across the cathode of the first diode and the cathode of the second diode.

In an embodiment, the first diode and a first resistor are arranged in series as a first string, wherein the anode of the first diode is connected to the resistor and wherein the cathode of the first diode is connected via a selector switch either with a first voltage or with a second voltage and wherein the opposite end of the first string is connected to a third voltage, the second diode and a second resistor are arranged in series as a second string, wherein the anode of the second diode is connected to the resistor and wherein the cathode of the second diode is connected via a selector switch either with the second voltage or with the first voltage and wherein the opposite end of the second string is connected to the third voltage, the selector switch is arranged to connect in a first state the cathode of the first diode to the second voltage and the cathode of the second diode to the first voltage or in a second state the cathode of the first diode to the first voltage and the cathode of the second diode to the second voltage.

In an embodiment, the selector switch is used for modulating the voltage difference and for conveying the information to the receiver component.

In an embodiment, a voltage difference between the anode of the first diode and the anode of the second diode is processed by an operational amplifier, the information modulated by the selector switch is determined at the output of the operational amplifier.

In an embodiment, the operational amplifier is biased to separate a signal that is based on triggering the selector switch from a signal that is not based on triggering the selector switch.

Hence, an offset voltage (or an offset voltage range) may be used to determine the information at the output of the operational amplifier only in case the selector switch has been toggled, which may apply in case of, e.g., a fault condition occurred at the sender component.

In an embodiment, the first voltage is a voltage between the switches of the half bridge, the second voltage is a supply voltage of the sender component and the third voltage is a supply voltage of the receiver component.

In an embodiment, the first voltage is a voltage between the switches of the half bridge, the second voltage is a supply voltage of the receiver component and the third voltage is a supply voltage of the sender component.

It is noted that a first information may be conveyed from the high side component towards the low side component or vice versa from the low side component towards the high side component.

In an embodiment, the information is further processes by a microcontroller, which controls the first electronic switch and the second electronic switch.

In an embodiment, the information is based on a fault condition.

The fault condition may be a low-power condition, a high-power condition, a short-circuit, a high-temperature condition, a low-temperature condition or the like.

In an embodiment, the sender component comprises a logic that is arranged to determine the fault condition and to convey the fault condition as the information to the receiver component.

The logic circuitry may be arranged to determine the fault condition, e.g., a short-circuit or a low-power condition, by itself or via a control unit. The logic circuitry may further be arranged to control a gate driver that controls the respective (high side or low side) switch of the half bridge.

Also, a method is provided for conveying an information from a sender component to a receiver component, wherein the sender component is a high side component and the receiver component is a low side component or wherein the sender component is a low side component and the receiver component is a high side component, wherein the low side component is arranged to drive a first electronic switch of a half bridge and the high side component is arranged to drive a second electronic switch of the half bridge, modulating a voltage and conveying the modulated voltage from the sender component across a first voltage-decoupling device and a second voltage-decoupling device depending on the information.

In an embodiment, the method comprises the step: processing the modulated voltage supplied by the sender component.

In an embodiment, the first voltage-decoupling device comprises a first diode and the second voltage-decoupling device comprises a second diode, wherein the information corresponds to a voltage difference modulated across the cathode of the first diode and the cathode of the second diode.

In one or more examples, the functions described herein may be implemented at least partially in hardware, such as specific hardware components or a processor. More generally, the techniques may be implemented in hardware, processors, software, firmware, or any combination thereof. If implemented in software, the functions may be stored on or transmitted over as one or more instructions or code on a computer-readable medium (e.g., a non-transitory computer readable medium) and executed by a hardware-based processing unit (e.g., a processor such as a microprocessor).

Computer-readable media may include computer-readable storage media, which corresponds to a tangible medium such as data storage media, or communication media including any medium that facilitates transfer of a computer program from one place to another, e.g., according to a communication protocol. In this manner, computer-readable media generally may correspond to (1) tangible computer-readable storage media which is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable medium.

By way of example, and not limitation, such computer-readable storage media can comprise RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. Also, any connection is properly termed a computer-readable medium, i.e., a computer-readable transmission medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transient media, but are instead directed to non-transient, tangible storage media. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

Instructions may be executed by one or more processors, such as one or more central processing units (CPU), digital signal processors (DSPs), general purpose microprocessors, application specific integrated circuits (ASICs), field programmable logic arrays (FPGAs), or other equivalent integrated or discrete logic circuitry. Accordingly, the term "processor," as used herein may refer to any of the foregoing structure or any other structure suitable for implementation of the techniques described herein. In addition, in some aspects, the functionality described herein may be provided within dedicated hardware and/or software modules configured for encoding and decoding, or incorporated in a combined codec. Also, the techniques could be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a single hardware unit or provided by a collection of interoperative hardware units, including one or more processors as described above, in conjunction with suitable software and/or firmware.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

What is claimed is:

1. A circuit for conveying an information from a sender component to a receiver component,
wherein the sender component is a high side component and the receiver component is a low side component or wherein the sender component is a low side component and the receiver component is a high side component;
wherein the low side component is arranged to drive a first electronic switch of a half bridge and the high side component is arranged to drive a second electronic switch of the half bridge;
wherein the circuit comprises a first voltage-decoupling device and a second voltage-decoupling device that are arranged such that a voltage conveyed from the sender component to the receiver component is modulated by the sender component and conveyed across the first voltage-decoupling device and the second voltage-decoupling device depending on the information;
wherein the first voltage-decoupling device comprises a first diode and the second voltage-decoupling device comprises a second diode, wherein the information corresponds to a voltage difference modulated across a cathode of the first diode and a cathode of the second diode;
wherein the circuit further comprises a first resistor, a second resistor, and a selector switch;
wherein the first diode and the first resistor are arranged in series as a first string, wherein an anode of the first diode is connected to the first resistor and wherein the cathode of the first diode is connected via the selector switch either with a first voltage or with a second voltage and wherein an opposite end of the first string is connected to a third voltage;
wherein the second diode and the second resistor are arranged in series as a second string, wherein an anode of the second diode is connected to the second resistor and wherein the cathode of the second diode is connected via the selector switch either with the second voltage or with the first voltage and wherein an opposite end of the second string is connected to the third voltage; and
wherein the selector switch is arranged to connect in a first state the cathode of the first diode to the second voltage and the cathode of the second diode to the first voltage or in a second state the cathode of the first diode to the first voltage and the cathode of the second diode to the second voltage.

2. The circuit according to claim 1, wherein the receiver component comprises a demodulator to process the modulated voltage supplied by the sender component.

3. The circuit according to claim wherein the selector switch is configured to modulate the voltage difference and for conveying the information to the receiver component.

4. The circuit according to claim 1, further comprising an operational amplifier,
wherein a voltage difference between the anode of the first diode and the anode of the second diode is processed by the operational amplifier; and
wherein the information modulated by the selector switch is determined at an output of the operational amplifier.

5. The circuit according to claim 4, wherein the operational amplifier is arranged to be biased to separate a signal that is based on triggering the selector switch from a signal that is not based on triggering the selector switch.

6. The circuit according to claim 1, wherein the first voltage is a voltage between the first and second electronic switches of the half bridge, the second voltage is a supply voltage of the sender component and the third voltage is a supply voltage of the receiver component.

7. The circuit according to claim 1, wherein the first voltage is a voltage between the first and second electronic switches of the half bridge, the second voltage is a supply voltage of the receiver component and the third voltage is a supply voltage of the sender component.

8. The circuit according to claim 1, further comprising a microcontroller configured to further process the information, the microcontroller controlling the first electronic switch and the second electronic switch.

9. The circuit according to claim 1, wherein the information is based on a fault condition.

10. The circuit according to claim 9, wherein the sender component comprises logic circuitry arranged to determine the fault condition and to convey the fault condition as the information to the receiver component.

11. A method for conveying an information from a sender component to a receiver component,
wherein the sender component is a high side component and the receiver component is a low side component or wherein the sender component is a low side component and the receiver component is a high side component;
wherein the low side component is arranged to drive a first electronic switch of a half bridge and the high side component is arranged to drive a second electronic switch of the half bridge;
wherein a first voltage-decoupling device comprises a first diode and a second voltage-decoupling device comprises a second diode, wherein the information corresponds to a voltage difference modulated across a cathode of the first diode and a cathode of the second diode;
wherein the first diode and a first resistor are arranged in series as a first string, wherein an anode of the first diode is connected to the first resistor and wherein the cathode of the first diode is connected via a selector switch either with a first voltage or with a second voltage and wherein an opposite end of the first string is connected to a third voltage;
wherein the second diode and a second resistor are arranged in series as a second string, wherein an anode of the second diode is connected to the second resistor and wherein the cathode of the second diode is connected via the selector switch either with the second voltage or with the first voltage and wherein an opposite end of the second string is connected to the third voltage;
wherein the selector switch is arranged to connect in a first state the cathode of the first diode to the second voltage and the cathode of the second diode to the first voltage or in a second state the cathode of the first diode to the first voltage and the cathode of the second diode to the second voltage; and
wherein the method comprises modulating a voltage and conveying the modulated voltage from the sender component across the first voltage-decoupling device and the second voltage-decoupling device depending on the information.

12. The method according to claim 11, further comprising processing the modulated voltage supplied by the sender component.

13. The method according to claim 11, wherein the first voltage-decoupling device comprises a first diode and the second voltage-decoupling device comprises a second diode, wherein the information corresponds to a voltage difference modulated across a cathode of the first diode and a cathode of the second diode.

14. The method according to claim 11, further comprising processing the information by a microcontroller, which controls the first electronic switch and the second electronic switch.

15. The method according to claim 11, wherein the information is based on a fault condition.

16. The method according to claim 15, wherein the sender component comprises logic circuitry that is arranged to determine the fault condition and to convey the fault condition as the information to the receiver component.

17. A circuit comprising:
a sender component;
a receiver component, wherein the sender component is a high side component and the receiver component is a low side component or wherein the sender component is a low side component and the receiver component is a high side component;
a half bridge comprising a first electronic switch and a second electronic switch, wherein the low side component is arranged to drive the first electronic switch of a half bridge and the high side component is arranged to drive the second electronic switch of the half bridge; and
a first voltage-decoupling device; and
a second voltage-decoupling device, wherein the first voltage-decoupling device and the second voltage-decoupling device are arranged such that a voltage conveyed from the sender component to the receiver component is modulated by the sender component and conveyed across the first voltage-decoupling device and the second voltage-decoupling device depending on information being conveyed from the sender component to the receiver component;
wherein the circuit further comprises a first resistor, a second resistor, and a selector switch,
wherein the first voltage-decoupling device comprises a first diode and the second voltage-decoupling device comprises a second diode;
wherein the information corresponds to a voltage difference modulated across a cathode of the first diode and a cathode of the second diode;
wherein the first diode and the first resistor are arranged in series as a first string, wherein an anode of the first diode is connected to the first resistor and wherein the cathode of the first diode is connected via the selector switch either with a first voltage or with a second voltage and wherein an opposite end of the first string is connected to a third voltage;
wherein the second diode and the second resistor are arranged in series as a second string, wherein an anode of the second diode is connected to the second resistor and wherein the cathode of the second diode is connected via the selector switch either with the second voltage or with the first voltage and wherein an opposite end of the second string is connected to the third voltage; and
wherein the selector switch is arranged to connect in a first state the cathode of the first diode to the second voltage and the cathode of the second diode to the first voltage or in a second state the cathode of the first diode to the first voltage and the cathode of the second diode to the second voltage.

* * * * *